(12) United States Patent
Dijon

(10) Patent No.: US 8,253,249 B2
(45) Date of Patent: Aug. 28, 2012

(54) CARBON NANOTUBE-BASED HORIZONTAL INTERCONNECT ARCHITECTURE

(75) Inventor: Jean Dijon, Champagnier (FR)

(73) Assignee: Commissariat a l'Energie Atomique, Paris (FR)

( * ) Notice: Subject to any disclaimer, the term of this patent is extended or adjusted under 35 U.S.C. 154(b) by 652 days.

(21) Appl. No.: 12/412,497

(22) Filed: Mar. 27, 2009

(65) Prior Publication Data

US 2009/0321106 A1    Dec. 31, 2009

(30) Foreign Application Priority Data

Jun. 25, 2008 (FR) ...................................... 08 54213

(51) Int. Cl.
*H01L 51/30* (2006.01)
(52) U.S. Cl. ................... 257/758; 257/E51.04; 977/742
(58) Field of Classification Search .................. None
See application file for complete search history.

(56) References Cited

U.S. PATENT DOCUMENTS

| | | | |
|---|---|---|---|
| 6,803,840 B2 * | 10/2004 | Hunt et al. ................ | 333/186 |
| 6,821,911 B1 * | 11/2004 | Lo et al. .................... | 438/780 |
| 7,094,692 B2 * | 8/2006 | Horibe et al. .............. | 438/680 |
| 7,718,531 B2 * | 5/2010 | Radisic et al. ............. | 438/678 |
| 2004/0245527 A1 * | 12/2004 | Tsukagoshi et al. ....... | 257/77 |
| 2005/0191774 A1 * | 9/2005 | Li et al. ..................... | 438/22 |
| 2005/0215049 A1 | 9/2005 | Horibe et al. | |
| 2006/0073682 A1 * | 4/2006 | Furukawa et al. ......... | 438/506 |
| 2006/0086958 A1 | 4/2006 | Eimori | |
| 2007/0205450 A1 | 9/2007 | Okita | |
| 2008/0095695 A1 | 4/2008 | Shanov et al. | |
| 2008/0213603 A1 * | 9/2008 | Kobayashi et al. ........ | 428/450 |
| 2010/0295024 A1 * | 11/2010 | Pernel et al. .............. | 257/24 |

OTHER PUBLICATIONS

Guofang Zhong, et al., "*Growth Kinetics of 0.5 cm Vertically Aligned Single-Walled Carbon Nanotubes*," The Journal of Physical Chemistry B (Letters), 2007, 111(8), 1907-1910.
Guo Fang Zhong et al., "*Semi-Quantitative Study on the Fabrication of Densely Packed and Vertically Aligned Single-Walled Carbon Nanotubes*," Carbon 44 (2006), 2009-2014.

* cited by examiner

*Primary Examiner* — Benjamin Sandvik
(74) *Attorney, Agent, or Firm* — Burr & Brown

(57) ABSTRACT

The invention relates to a device which makes it possible to establish a horizontal electrical connection between at least two bonding pads. This device comprises horizontal carbon nanotubes which link the vertical walls of said bonding pads and the bonding pads are made by stacking layers of at least two materials, one of which catalyzes growth of the nanotubes and the other of which acts as a spacer between the layers of material which catalyzes growth of the nanotubes.

17 Claims, 6 Drawing Sheets

A)

B)

C)

D)

A)

B)

C)

D)

CARBON NANOTUBE-BASED HORIZONTAL INTERCONNECT ARCHITECTURE

FIELD OF THE INVENTION

The present invention relates to a horizontal interconnect device based on horizontal growth of carbon nanotubes (CNT).

BACKGROUND OF THE INVENTION

Carbon nanotubes are a potential solution for realizing interconnections, especially by forming vias or interconnect lines.

As far as interconnect lines are concerned, an extremely dense material consisting of a strand of single-walled nanotubes (SWCNT) or nanotubes having a small number of walls (multi-walled carbon nanotube (MWCNT) is capable of establishing a connection between bonding pads as shown in the diagram in FIG. 1.

One feasible technical solution for producing this type of product involves using catalytic growth of carbon nanotubes. In fact, nanotubes having a length of several millimeters have already been produced [1] and this length is sufficient for the envisaged applications.

Nevertheless, producing such a product entails technical difficulties which have not yet been overcome:

Localizing growth of the nanotubes on the flanks of the structure;
Guiding the nanotubes from one bonding had to the adjacent pad;
Producing a connection with a very high density of electrically connected CNTs.

The last issue is especially problematic. So far, very high densities of nanotubes have only been obtained on insulating films [2].

The objective of the invention is therefore to propose a technical solution which makes it possible to solve these problems and, especially, to overcome the difficulty of depositing a catalytic layer in order to initiate the growth of nanotubes on vertical walls.

SUMMARY OF THE INVENTION

The present invention discloses the first ever possible way of using carbon nanotubes in order to obtain horizontal connections between bonding pads.

Thus, according to a first aspect, the present invention relates to a device which makes it possible to establish a horizontal electrical connection between at least two bonding pads, this device being based on horizontal carbon nanotubes which link the vertical walls of the bonding pads.

Specifically and in relation to the fabrication method described below, the device according to the invention involves bonding pads produced by a stack of layers of at least two materials, one of which catalyzes the growth of nanotubes and the other of which acts as a spacer between layers which encourage growth.

This stack of layers or multilayer which advantageously comprises alternate layers of the two types of material ensures both horizontal growth of the carbon nanotubes and also temperature-stable nanometric division of the catalyst.

The catalytic multilayer is useful for producing a structure with a nanometric pitch in one direction which ensures temperature-stable fragmentation of the metal layer. The multilayer is easy to deposit and this avoids the problem of depositing a growth catalyst on the vertical flanks of a structure.

The other function of this stack is to ensure electrical conduction. Thus, at least one of the materials, or even both of them, are electrically conductive.

According to one advantageous characteristic of the invention, the catalyst of each of the stacks may be in the form of a continuous layer or in the form of a layer comprised of clusters.

Several arrangements can be envisaged:

In a first embodiment, it is the catalytic material which is electrically conductive. This material is advantageously a metal, especially iron (Fe), or a metal alloy.

Two options are possible in combination with this electrically conductive catalytic material:

The material which acts as a spacer can be a dielectric material. This material is advantageously an oxide such as alumina (aluminum oxide), silica (silicon oxide) or magnesium oxide (MgO).

Alternatively, the material which acts as a spacer is also electrically conductive. This material is advantageously a semiconductor such as silicon (Si) or a conductive oxide such as ITO (tin-doped indium oxide) or ruthenium oxide (RuO).

All these materials are favorable for the growth of nanotubes. In addition, electrical continuity between the strands of nanotubes is ensured by the buried catalytic layers.

According to another embodiment, the catalytic material is a dielectric material, advantageously an insulating iron oxide, and the material which acts as a spacer is electrically conductive, advantageously a metal such as iron (Fe), palladium (Pd) or titanium (Ti), or a conductive oxide such as ITO (tin-doped indium oxide) or ruthenium oxide (RuO).

Advantageously, the bonding pads have a rhomboid cross-section. This way, it is possible to obtain a nanotube density regardless of the width of the channels. In fact, the width of the connection depends solely on the position of the flank of the channel relative to the tip of the rhombus, not on the size of the bonding pad. Because of this, one can produce arrays of standard bonding pads and obtain a connection thinness solely by positioning the tip of the end of the channel at the right distance when the channel is etched.

The central part of the bonding pads may preferably also contain an electrically conductive vertical feedthrough which is advantageously made of a metal such as copper.

Another aspect of the invention relates to the method which makes it possible to produce such a horizontal interconnect device based on carbon nanotubes.

This method involves the following essential steps:
deposit a stack of layers of at least two materials as defined above on a substrate;
define bonding pads on the basis of this stack;
embed these bonding pads in a dielectric matrix;
form channels in the dielectric matrix in order to define interconnect lines between the bonding pads and to guide growth of the nanotubes between the bonding pads;
grow the carbon nanotubes in the channels, thus producing horizontal connections between the bonding pads.

The essential steps involved in the method according to the invention are shown schematically in FIG. 2 which is a cross-sectional view and in FIG. 3 which is a top view.

These stacked layers which fulfill a catalytic function and ensure electrical conduction, drastically simplify the technology which is to be implemented since it merely involves depositing horizontal layers.

The bonding pads can be defined by dry or wet etching and a resin must be deposited on the stack beforehand in order to produce the bonding pads by lithography.

Sacrificial layers may be deposited under the stack or even on top of it before depositing resin in order to facilitate producing the contact metal.

The insulating (or dielectric) matrix in which the bonding pads are embedded advantageously consists of an oxide or a nitride or a material which has a low dielectric constant. This matrix may be alumina, for example.

In order to connect two points, the channels in the insulating material are then opened, thus exposing the catalytic multilayer which becomes active in order to grow the connection. One then grows the nanotubes in the areas which are opened up and guide the nanotubes.

According to one preferred embodiment, a layer of a contact material which inhibits the growth of nanotubes and encourages electrical contact, for example palladium, is deposited on at least one of the vertical faces of the bonding pads before growing the nanotubes.

Advantageously, these are the faces of the bonding pads that are opposite a growth face. Thus, as they grow, the nanotubes connect to the opposite-facing surface and establish self-contact on the bonding pad opposite the growth pad.

Consequently, in the final arrangement, at least one of the two bonding pads to be connected is covered, in the area which is in contact with the carbon nanotubes, with said material.

Deposition of this material, which is advantageously metallic, in order to improve contact between the nanotubes and bonding pads is shown in FIGS. 4 and 6.

BRIEF DESCRIPTION OF THE DRAWINGS

The way in which the invention can be implemented and its resulting advantages will be made more readily understandable by the descriptions of the following embodiments, given merely by way of example, reference being made to the accompanying drawings.

DETAILED DESCRIPTION OF THE INVENTION

Example 1

In this example, the dielectric which constitutes the spacer material of the bonding pads and the material in which the bonding pads are embedded are identical.

Figure 1:
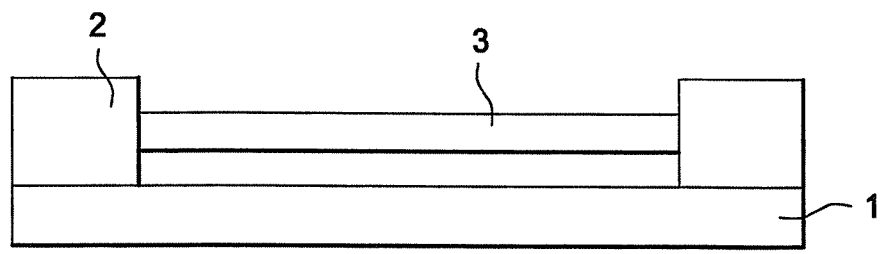
FIG. 1 schematically shows the CNT-based horizontal interconnect principle.
Figure 2:
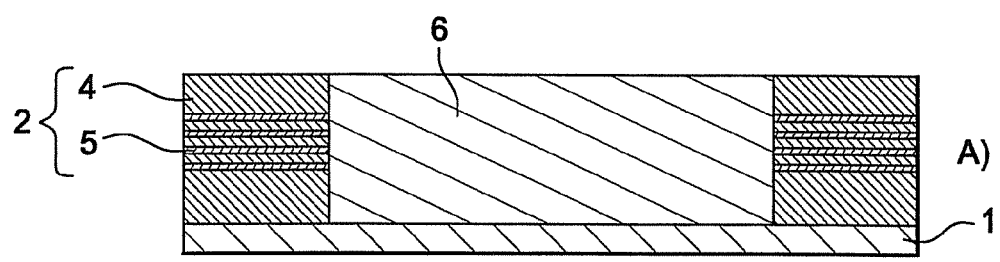
FIG. 2 shows a cross-sectional view of the various steps involved in the method in accordance with the invention which make it possible to create a CNT-based horizontal connection.
- A. Stack comprising multilayer bonding pads and the dielectric;
- B. Open up channels in dielectric in order to define connections;
- C. Optionally deposit a material in order to improve contact of nanotubes and of structure;
- D. Grow nanotubes between the bonding pads.
Figure 2:
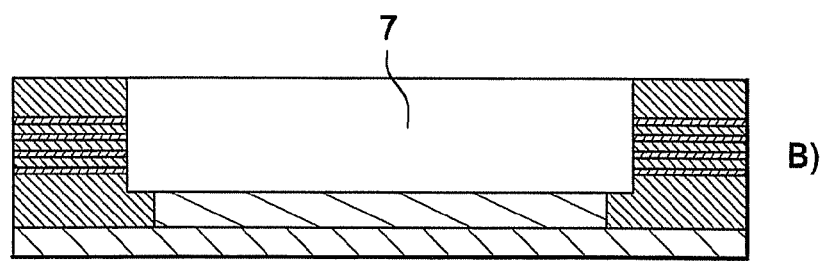
Figure 2:
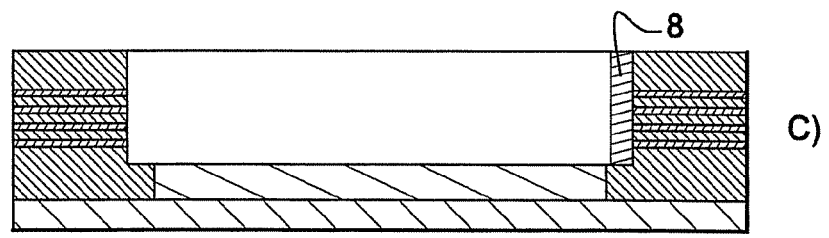
Figure 2:
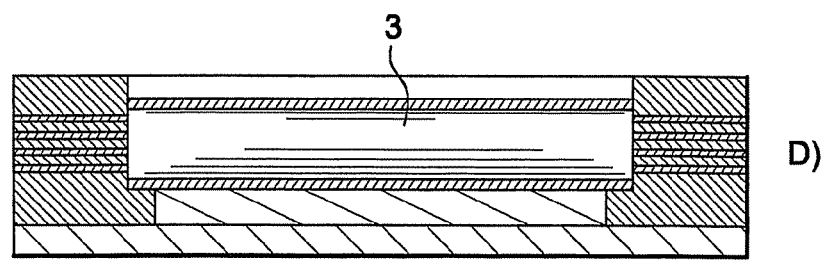
Figure 3:
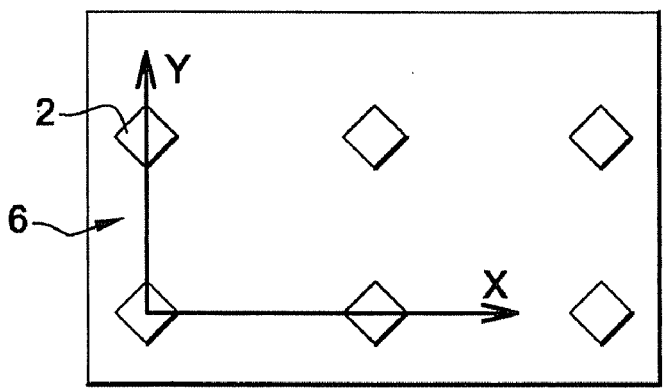
FIG. 3 shows a top view of the various steps involved in the method in accordance with the invention which make it possible to create a CNT-based horizontal connection:
- A. Bonding pads arranged in a rectangular array and embedded in a dielectric;
- B. Open up channels in the dielectric at the location of future connections;
- C. Optionally deposit a material in order to improve contact;
- D. Grow nanotubes between the bonding pads.
Figure 3:
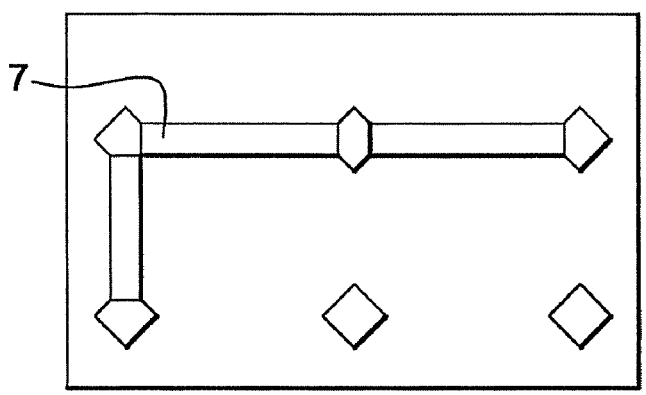
Figure 3:
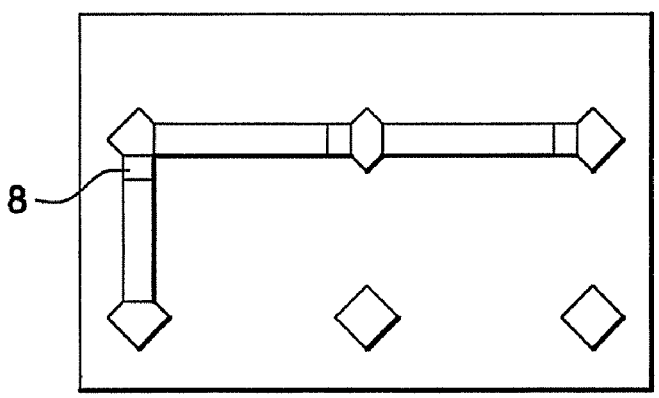
Figure 3:
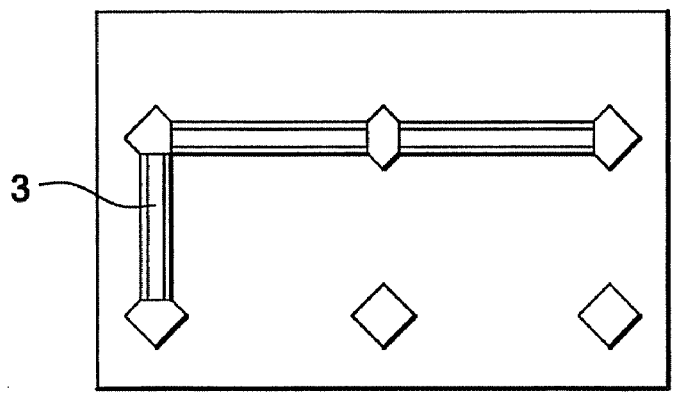
Figure 4:
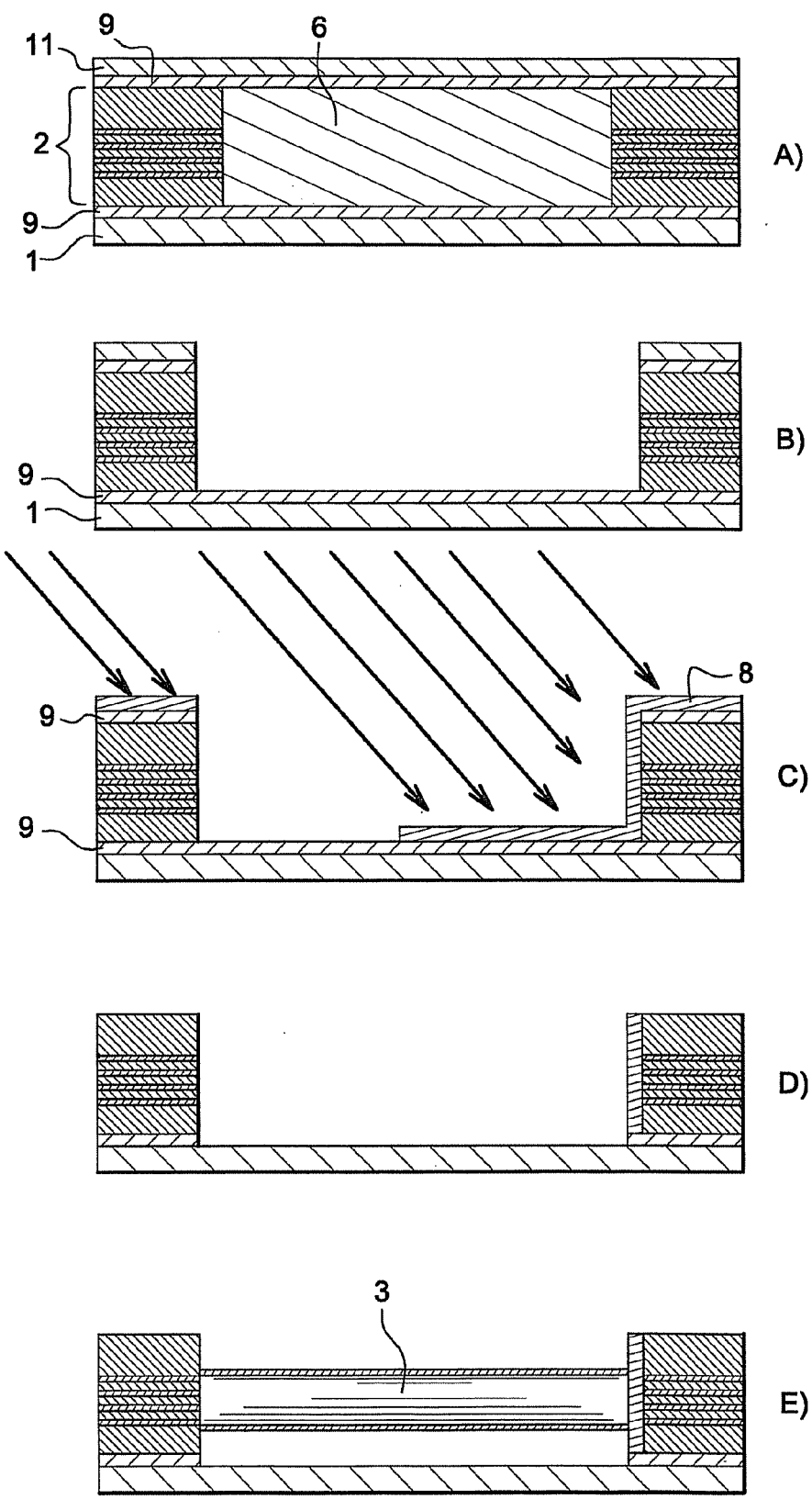
FIG. 4 shows a cross-sectional view of the various steps involved in the method according to the invention which include covering at least one of the faces of the bonding pad with a metal which ensures nanotube/bonding pad contact:
- A. Stack with sacrificial layers before depositing resin in order to define the channels;
- B. Open up the channels, stopping at the lower sacrificial layer;
- C. Deposit the contact metal at an angle, only covering one of the bonding pads of the channel after removing the resin;
- D. Lift off the contact metal layer by removing the sacrificial layers;
- E. Grow the nanotubes with self-contact on the metal layer.
Figure 5:
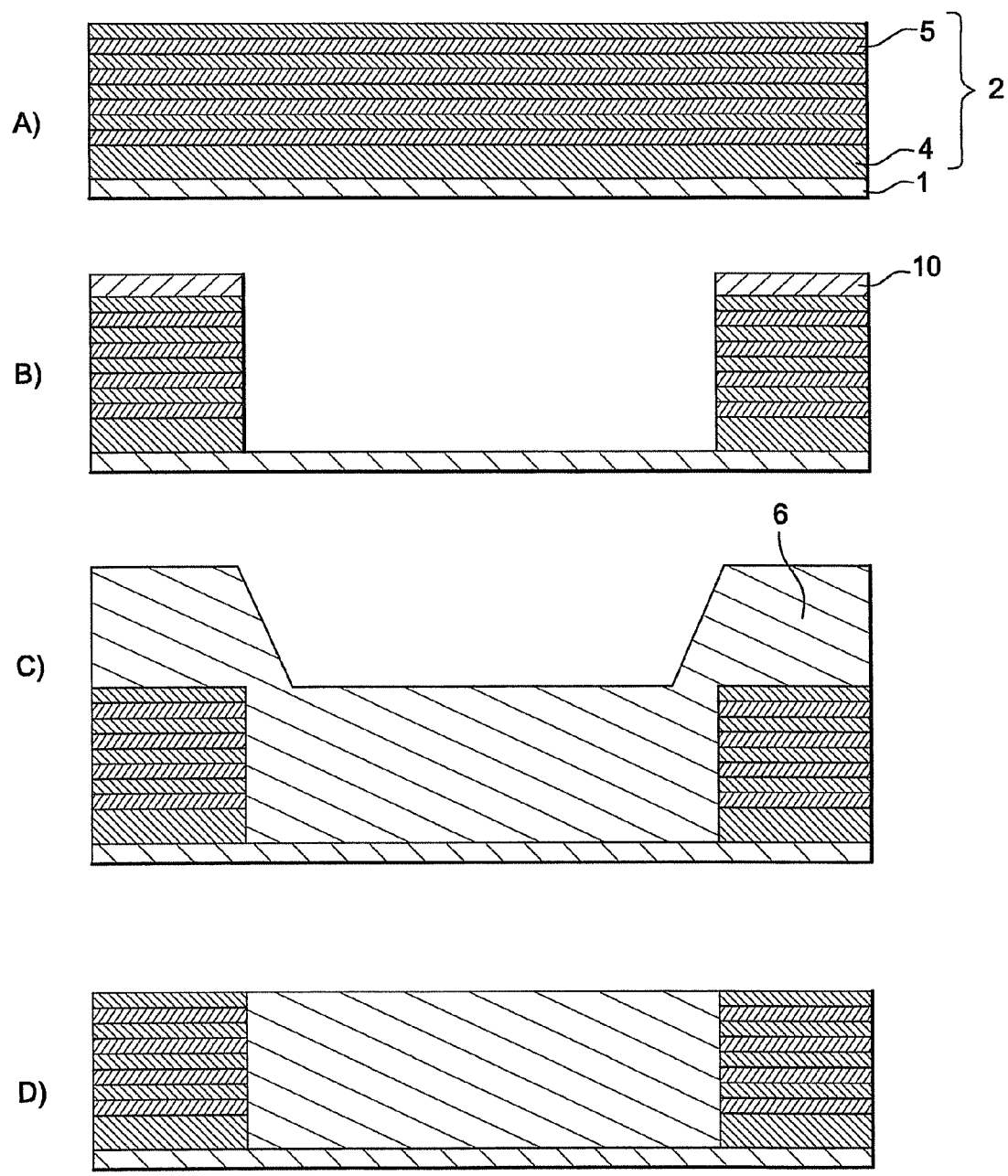
FIG. 5 shows the various steps performed to produce a bonding pad comprising a stack of layers:
- A. Deposit the metal/dielectric multilayer;
- B. Define the bonding pads by lithography;
- C. Deposit the second dielectric;
- D. Planarize the structure.

1/Produce Catalytic Bonding Pads Embedded in a Dielectric (FIG. 5):

use ion beam sputtering (IBS) to deposit a multilayer of twenty alumina (dielectric=spacer 4)/iron (metal=electrically conductive catalyst 5) layers on substrate 1 which can be an electronic component that is to be connected (FIG. 5A). The thickness of these layers ranges from 0.25 to 2 nanometers.

deposit resin 10 on the stack thus constituted and use lithography to produce catalytic bonding pads 2 by dry etching or wet etching using, for example, an $H_3PO_4$ solution which attacks iron and alumina (FIG. 5B).

note that the first insulating layer of the stack, the last such layer or both layers may be thicker than the insulating layers of the catalytic system.

once etching has been completed, deposit alumina (second dielectric 6) by sputtering over the entire sample so as to bury the bonding pads (FIG. 5C).

planarize the deposited material by chemo-mechanical polishing (CMP) (FIG. 5D).

Figure 6:
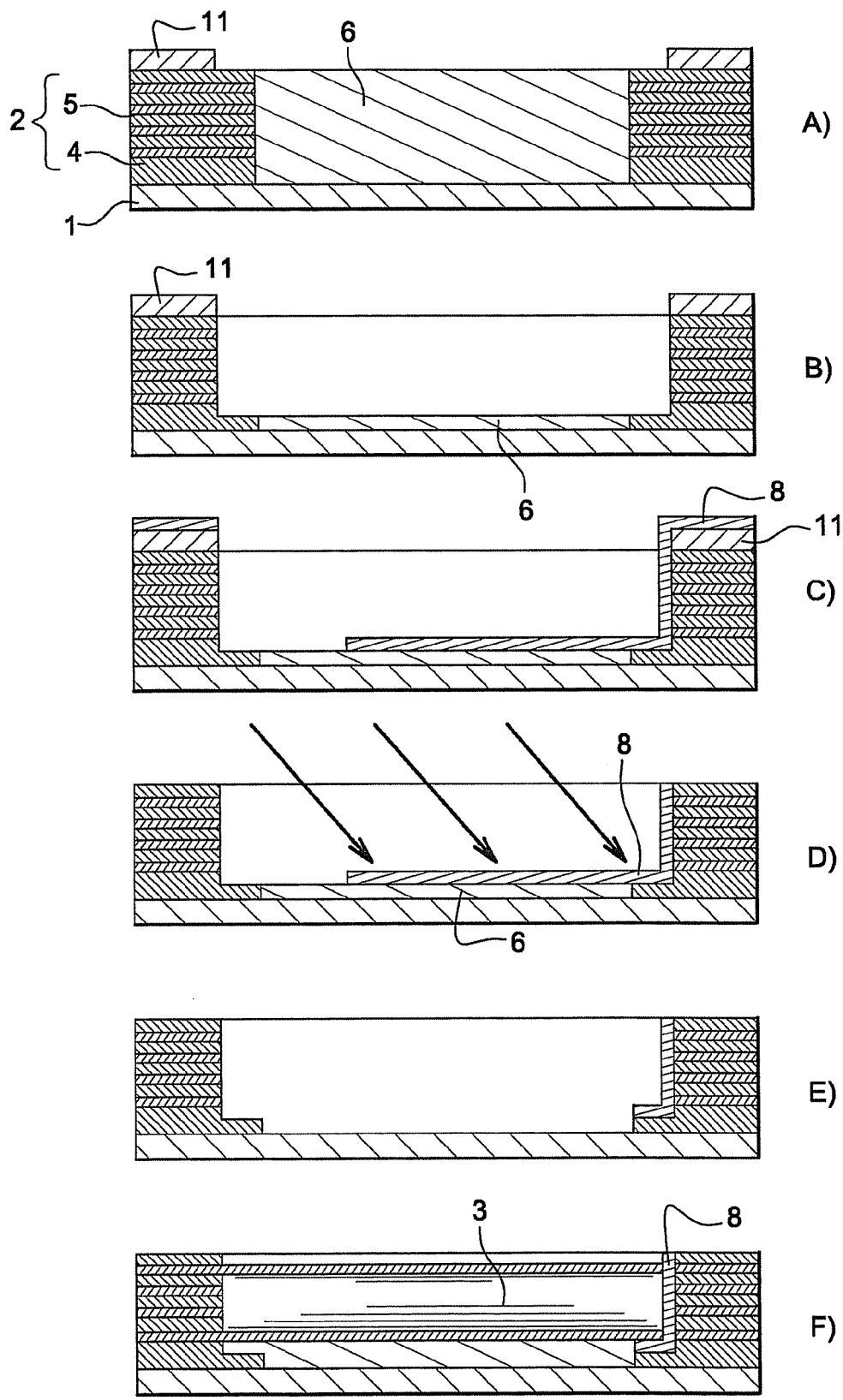
FIG. 6 schematically shows an alternative embodiment of the method according to the invention without any sacrificial sublayer. In this case, controlled etching makes it possible to leave a layer of dielectric material which then fulfils the same function as the sacrificial layer in FIG. 4:
- A. Deposit resin in order to define the channels;
- B. Etch the channels and bonding-pad patterns, leaving a fine dielectric layer;
- C. Deposit the contact metal at an angle parallel to the channels;
- D. Lift off the contact metal deposited on the resin;
- E. Lift off the contact metal deposited on the dielectric layer;
- F. Grow the nanotubes with self-contact on the metal layer.

2/Produce Channels 7 (FIG. 6):

spread a second resin 11 over the entire sample so as to produce the desired connection pattern (FIG. 6A).

use an $H_3PO_4$ solution or plasma etching to open up the pattern thus defined, leaving a layer of alumina 6 at the bottom of the channels approximately 20 nanometers thick (FIG. 6B).

use electron gun sputtering at a grazing incidence to deposit a 2 to 5 nanometer thick layer of palladium 8 (FIG. 6C). The sample does not rotate. The plane of incidence (comprising the normal to the sample and the incident flux direction) intersects the plane of the sample in one of the directions of the grooves (see below FIG. 7).

deposit a second identical layer after turning the sample through 90°.

lift off the resin 11 (FIG. 6D).

lift off the second dielectric layer 6 (FIG. 6E).

use diluted acetylene in a 50% hydrogen/50% helium mixture to grow nanotubes 3 at a temperature of 400 to 650° C. Nanotubes 3 connect to the opposite-facing surface which carries palladium 8 (FIG. 6F).

Figure 7:
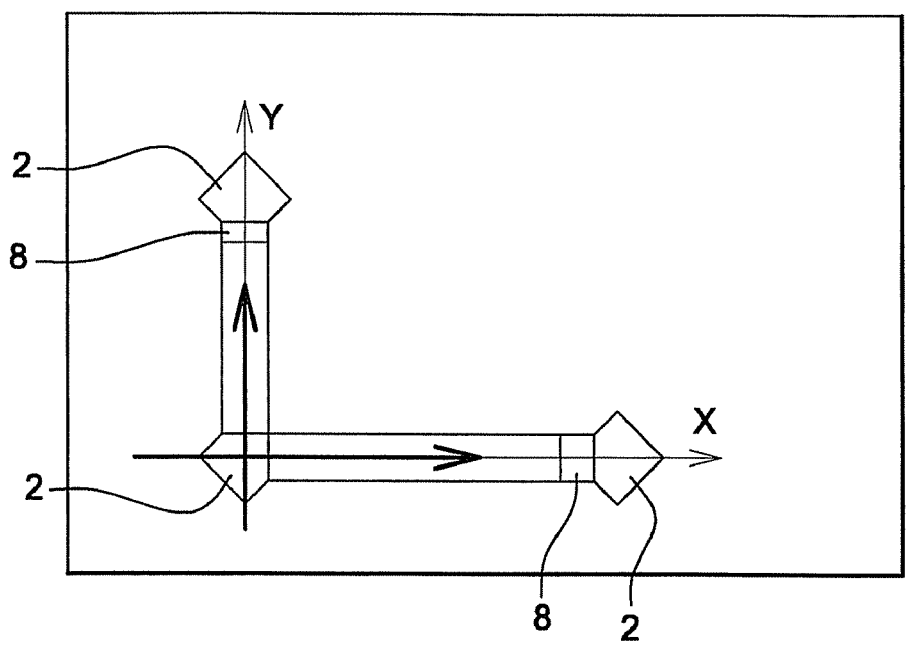
FIG. 7 is a top view showing the direction of deposition, depending on the direction of the grooves.

FIG. 7 shows a top view of the materials deposited during step C in two perpendicular directions.

Example 2

Second dielectric 6 used to bury bonding pads 2 consists of silica or a material which has a low dielectric constant ("low K") or extremely low dielectric constant ("ultra low K").

Example 3

Metal catalytic layers 5 are produced by depositing metallic clusters.

Example 4

The layer used as spacer 4 in the catalytic stack is a layer of silicon.

Example 5

Figure 8:
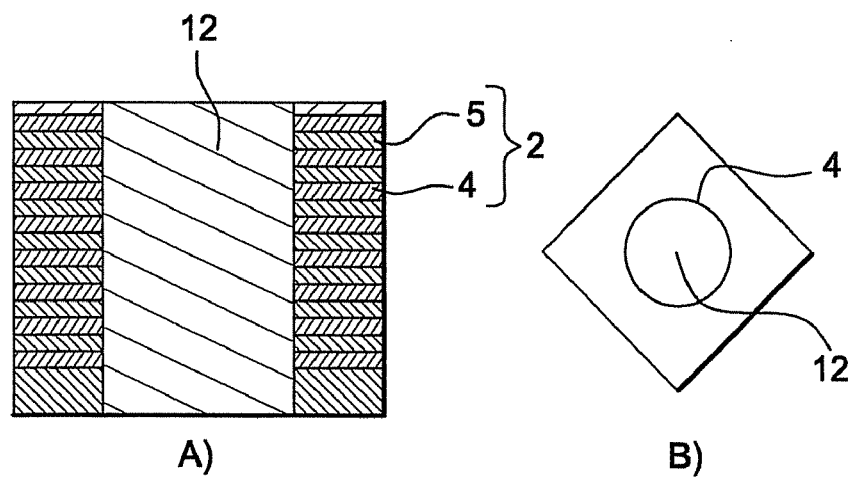
FIG. 8 is a cross-sectional view (A) and a top view (B) of a bonding pad which ensures a vertical connection thanks to its central part which is filled with a metal.

Vertical connection "vias" are produced in the centre of the catalytic bonding pads. This example is shown schematically in FIG. 8. A metal 12, such as copper, passes through bonding pad 2 and ensures vertical connection.

Reference Documents

[1] Zhong et al., J. Phys. Chem. B (Letters), 2007, 111(8): 1907-1910.
[2] Zhong et al., Carbon, 2006, 44: 2009-2014.

The invention claimed is:

1. A device to establish a horizontal electrical connection between at least two bonding pads comprising horizontal carbon nanotubes which link vertical walls of said bonding pads, said bonding pads being produced by means of a stack of layers of at least two materials, one material of which catalyzes growth of the nanotubes and the other material of which acts as a spacer between the layers of material which catalyze growth of the nanotubes, wherein at least the layer of material which catalyzes growth of the nanotubes extends only in a horizontal direction.

2. The device as claimed in claim 1, wherein the material which catalyzes growth of the nanotubes is in the form of one of a continuous layer and a layer comprising clusters.

3. The device as claimed in claim 1, wherein the catalytic material is an electrically conductive metal or metal alloy.

4. The device as claimed in claim 3, wherein the material which acts as a spacer is a dielectric material.

5. The device as claimed in claim 1, wherein the material which acts as a spacer is electrically conductive.

6. The device as claimed in claim 1, wherein the catalytic material is a dielectric material and wherein the material which acts as a spacer is electrically conductive.

7. The device as claimed in claim 1, wherein the bonding pads have a rhomboid cross-section.

8. The device as claimed in claim 1, wherein at least one of the two bonding pads which are to be connected is covered, in the area in which it comes into contact with carbon nanotubes, with a contact material.

9. The device as claimed in claim 1, wherein the bonding pads contain an electrically conductive vertical feedthrough which is made of a metal.

10. The device as claimed in claim 4, wherein the dielectric material is an oxide of one of alumina, silica and magnesium.

11. The device as claim in claim 5, wherein the material which acts as a spacer is a semiconductor.

12. The device as claimed in claim 11, wherein the semiconductor is one of silicon and a conductive oxide.

13. The device as claimed in claim 12, wherein the conductive oxide is one of tin-doped indium oxide and ruthenium oxide.

14. The device as claimed in claim 6, wherein the dielectric material is an insulating iron oxide.

15. The device as claimed in claim 6, wherein the material which acts as a spacer is selected from the group consisting of iron, palladium, titanium, tin-doped indium oxide and ruthenium oxide.

16. The device as claimed in claim 8, wherein the contact material is palladium.

17. The device as claimed in claim 9, wherein the conductive vertical feedthrough is made of copper.

* * * * *